(12) United States Patent
Kim et al.

(10) Patent No.: US 9,036,439 B2
(45) Date of Patent: May 19, 2015

(54) SEMICONDUCTOR MEMORY DEVICE HAVING IMPROVED REFRESH CHARACTERISTICS

(75) Inventors: Jung-sik Kim, Seoul (KR); Cheol Kim, Seoul (KR); Sang-ho Shin, Yongin-si (KR); Jung-bae Lee, Seongnam-si (KR); Chan-yong Lee, Suwon-si (KR); Sung-min Yim, Suwon-si (KR); Tae-seong Jang, Suji-gu (KR); Joo-sun Choi, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 257 days.

(21) Appl. No.: 13/548,484

(22) Filed: Jul. 13, 2012

(65) Prior Publication Data

US 2013/0016574 A1 Jan. 17, 2013

Related U.S. Application Data

(60) Provisional application No. 61/508,136, filed on Jul. 15, 2011.

(30) Foreign Application Priority Data

Feb. 29, 2012 (KR) .................... 10-2012-0021407

(51) Int. Cl.
- *G11C 29/08* (2006.01)
- *G11C 7/00* (2006.01)
- *G11C 29/50* (2006.01)
- *G11C 11/406* (2006.01)
- *G11C 5/04* (2006.01)
- *G11C 11/40* (2006.01)

(52) U.S. Cl.
CPC ........ *G11C 29/50016* (2013.01); *G11C 11/406* (2013.01); *G11C 11/40615* (2013.01); *G11C 5/04* (2013.01); *G11C 11/40* (2013.01); *G11C 11/40622* (2013.01)

(58) Field of Classification Search
CPC ................. G11C 11/406; G11C 11/40615
USPC ..................... 365/222, 201, 189.07
See application file for complete search history.

(56) References Cited

U.S. PATENT DOCUMENTS

| | | | |
|---|---|---|---|
| 6,930,943 B2 * | 8/2005 | Kim .............................. | 365/222 |
| 7,397,719 B2 * | 7/2008 | Takahashi et al. ............ | 365/222 |
| 7,457,177 B2 * | 11/2008 | Perry et al. .................... | 365/201 |
| 2011/0058438 A1 * | 3/2011 | Kagami ......................... | 365/222 |
| 2011/0069572 A1 * | 3/2011 | Lee et al. ....................... | 365/222 |
| 2011/0292710 A1 * | 12/2011 | Matsubayashi et al. ........ | 365/94 |

FOREIGN PATENT DOCUMENTS

| | | |
|---|---|---|
| JP | 11-086598 A | 3/1999 |
| KR | 100505832 B1 | 8/2005 |
| KR | 100631935 B1 | 10/2006 |
| KR | 100656717 B1 | 12/2006 |

* cited by examiner

*Primary Examiner* — Hoai V Ho
*Assistant Examiner* — Tri Hoang
(74) *Attorney, Agent, or Firm* — Harness, Dickey & Pierce, P.L.C.

(57) ABSTRACT

A semiconductor memory device having improved refresh characteristics includes a memory array including a plurality of memory cells; a test unit configured to test refresh characteristics of the memory array and generate a first fail address signal; a storage unit configured to store the first fail address signal; and a refresh unit configured to perform a refresh operation on the memory array, wherein the refresh unit is configured to receive the first fail address signal from the storage unit, perform the refresh operation on a first memory cell that does not correspond to the first fail address signal according to a first period, and perform the refresh operation on a second memory cell that corresponds to the first fail address signal according to a second period that is shorter than the first period.

20 Claims, 14 Drawing Sheets

SEMICONDUCTOR MEMORY DEVICE HAVING IMPROVED REFRESH CHARACTERISTICS

CROSS-REFERENCE TO RELATED APPLICATIONS

This application claims the benefit of U.S. Provisional Patent Application No. 61/508,136, filed on Jul. 15, 2011, in the U.S. Patent and Trademark Office, and the benefit of Korean Patent Application No. 10-2012-0021407, filed on Feb. 29, 2012, in the Korean Intellectual Property Office, the disclosures of which are incorporated herein in their entirety by reference.

BACKGROUND

The inventive concepts relate to a semiconductor memory device and more particularly, to a semiconductor memory device having improved refresh characteristics.

A dynamic memory device such as a dynamic random access memory (DRAM) stores data in the form of charges. The stored charges deteriorate due to a leakage current. In this case, the data stored in the memory device may be lost. Thus, before the data is lost, the data needs to be read from a memory cell and the memory cell needs to be charged again according to the read data. The data stored in the memory cell is retained by repeating this process.

SUMMARY

The inventive concepts provide a semiconductor memory device having improved refresh characteristics.

According to an example embodiment of the inventive concepts, there is provided a semiconductor memory device including a memory array including a plurality of memory cells; a test unit configured to test refresh characteristics of the memory array and generate a first fail address signal; a storage unit configured to store the first fail address signal; and a refresh unit configured to perform a refresh operation on the memory array, wherein the refresh unit is configured to receive the first fail address signal from the storage unit, perform the refresh operation on a first memory cell that does not correspond to the first fail address signal according to a first period, and perform the refresh operation on a second memory cell that corresponds to the first fail address signal according to a second period that is shorter than the first period.

The test unit may be configured to perform the refresh operation on the memory array, determine whether the memory array retains data after a desired (or alternatively, predetermined)time elapses, and store a row address signal corresponding to a memory cell that does not retain the data in the storage unit as the first fail address signal.

The refresh unit may include a comparator configured to compare the first fail address signal with a first address signal corresponding to the first memory cell, and the first fail address signal with a second address signal corresponding to the second memory cell, and generate a comparison signal; and a period controller configured to generate a period setting signal according to the comparison signal and transmit the period setting signal to the memory array.

The semiconductor memory device may further include a mode register configured to store a test mode code, wherein the test unit may be activated in response to the test mode code stored in the mode register.

The first period may be a multiple of the second period. In addition, the storage unit may include an electrical fuse.

The memory array may include a first memory block including the first memory cell, and a second memory block including the second memory cell, and the refresh unit may be configured to perform the refresh operation on the first memory block according to the first period and perform the refresh operation on the second memory block according to the second period.

The memory array may include a first bank and a second bank which each include a first memory cell and a second memory cell, while the second bank is activated, the first bank may be inactivated, and the refresh unit may be configured to perform the refresh operation on the first memory cell and the second memory cell of the first bank that is inactivated.

The test unit may be configured to test the refresh characteristics of the plurality of memory cells and generate a second fail address signal, the storage unit may be configured to store the second fail address signal, and the refresh unit may be configured to perform the refresh operation on a third memory cell corresponding to the second fail address signal according to a third period that is shorter than the second period.

According to another example embodiment of the inventive concepts, there is provided a system including the semiconductor memory device; and an external device configured to issue a command for activating the test unit included in the semiconductor memory device.

The semiconductor memory device may further include a mode register configured to store a test mode code, and if the external device transmits the test mode code to the mode register and the test mode code is stored in the mode register, the test unit may be activated in response to the test mode code stored in the mode register.

According to another example embodiment of the inventive concepts, there is provided a semiconductor memory device including a memory array including a first memory cell and a second memory cell; a storage unit configured to store as a fail address signal a second address signal corresponding to the second memory cell; and a refresh unit configured to perform a refresh operation on the memory array, wherein the refresh unit is configured to receive the fail address signal from the storage unit, not refresh the first memory cell, and refresh the second memory cell, in a first time section, and wherein the refresh unit is configured to refresh both the first memory cell and the second memory cell, in a second time section.

The refresh unit may be configured to perform the refresh operation on the second memory cell according to a second period corresponding to a time difference between the first time section and the second time section, and perform the refresh operation on the first memory cell according to a first period that is longer than the second period.

The semiconductor memory device may further include a built in self-test (BIST) unit configured to test refresh characteristics of the memory array, generate the fail address signal, and store the fail address signal in the storage unit.

According to another example embodiment of the inventive concepts, there is provided a system including the semiconductor memory device: and a memory control unit configured to control the semiconductor memory device, wherein the memory control unit is configured to test refresh characteristics of the memory array included in the semiconductor memory device, generate the fail address signal, and store the fail address signal in the storage unit.

According to another example embodiment of the inventive concepts, a semiconductor memory device includes a memory cell; a test unit configured to test refresh characteristics of the memory cell to determine whether the memory cell is a good cell or a bad cell; a storage unit configured to store a row address of the memory cell if the memory cell is a bad cell; and a refresh unit configured to refresh the memory cell according to a refresh period, the refresh period being based on whether the memory cell is a good cell or a bad cell.

The refresh period may be a first period if the memory cell is a good cell and the refresh period may be a second period if the memory cell is a bad cell, and the second period may different than the first period. The second period may be shorter than the first period.

The refresh operation may include first, second, and third time sections, and the refresh unit may be configured to refresh a good cell at the first and third time sections and refresh a bad cell at the first, second, and third time sections.

The memory cell may be one of a plurality of memory cells in a memory array, and the refresh unit may be configured to refresh each memory cell in the memory array according to the refresh period.

The refresh unit may include: a comparator configured to generate a comparison signal based on the stored row address of the memory cell and a refresh address, the comparison signal indicating whether the refresh address corresponds to a good cell or a bad cell; and a period controller configured to generate a period setting signal indicating the refresh period based on the comparison signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

The inventive concepts will now be described more fully with reference to the accompanying drawings, in which some example embodiments are shown. The inventive concepts may, however, be embodied in many different forms and should not be construed as being limited to the embodiments set forth herein; rather, these embodiments are provided so that this disclosure will be thorough and complete, and will fully convey the inventive concepts to those skilled in the art.

The terminology used herein is for the purpose of describing particular embodiments only and is not intended to be limiting of the inventive concepts. As used herein, the singular forms "a," "an", and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Embodiments of the inventive concepts are described herein with reference to schematic illustrations of exemplary embodiments (and intermediate structures). As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing.

Figure 1:
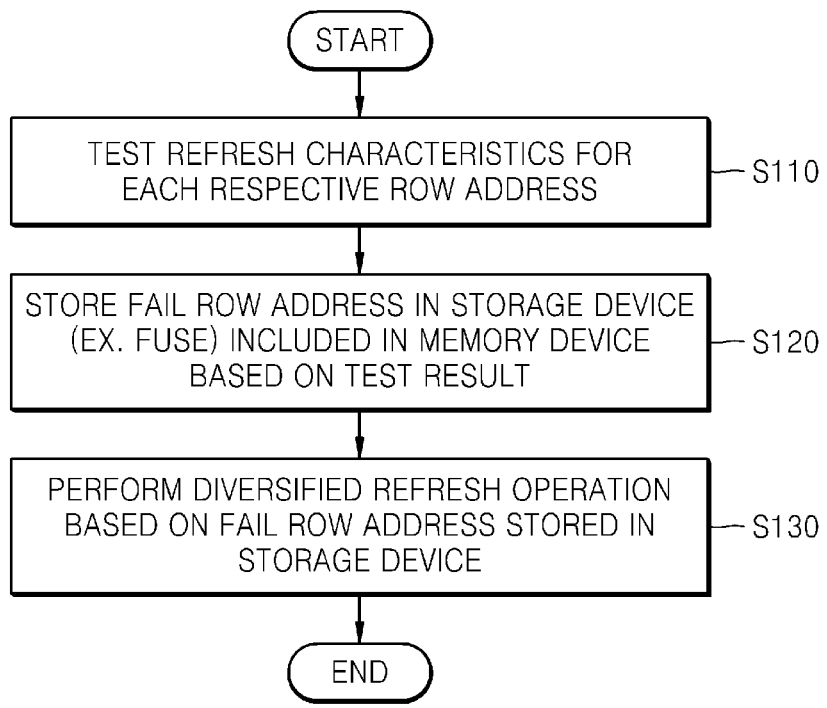
FIG. 1 is a flowchart of an operating method of a semiconductor memory device, according to an example embodiment of the inventive concepts.

FIG. 1 is a flowchart of an operating method of a semiconductor memory device 700a (from FIG. 10), according to an example embodiment of the inventive concepts.

Figure 10:
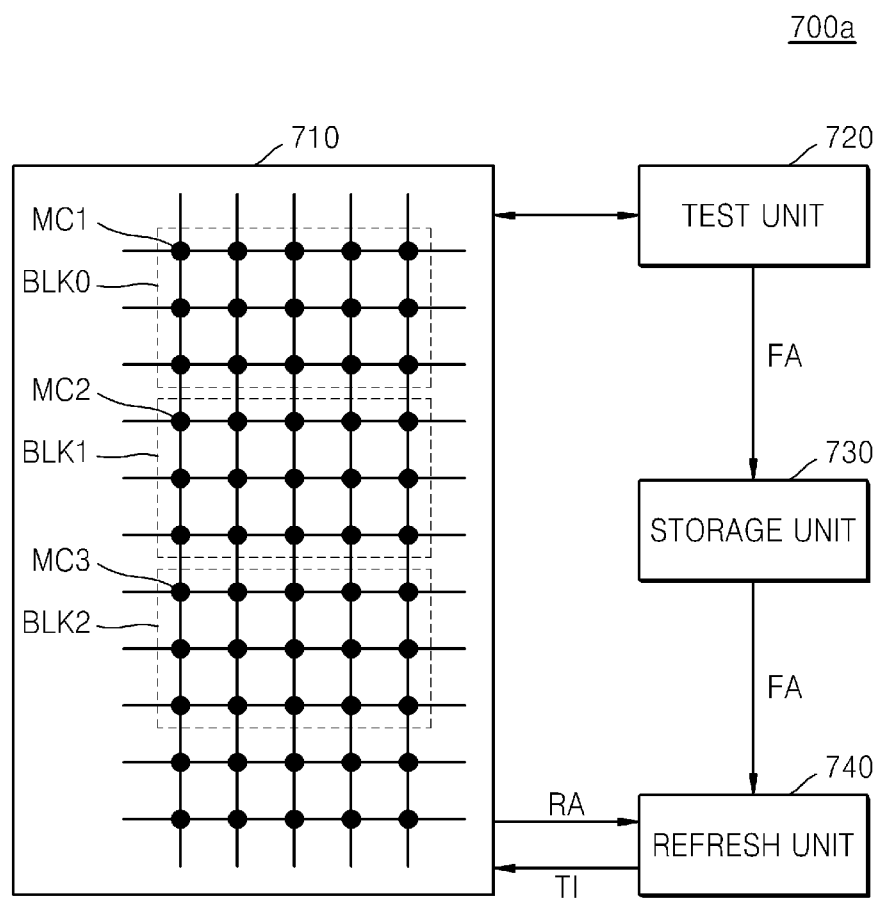
FIG. 10 is a block diagram of a semiconductor memory device according to an example embodiment of the inventive concepts.

Referring to FIGS. 1 and 10, a test operation S110 for testing refresh characteristics of each respective row address is performed. For example, the refresh characteristics of a first row address including a first memory cell MC1 may be tested and then the refresh characteristics of a second row address including a second memory cell MC2 may be tested. In this case, refresh characteristics may refer to a retention time (i.e., a period of time that stored data is retained) of charges stored in a memory cell and may be referred to as a refresh period. The test operation S110 may be performed by a test unit 720 (for example, a built in self-test (BIST) unit) included in the semiconductor memory device 700a or an external device 810 (see FIGS. 13 and 14) such as a memory control unit.

When the test operation S110 is performed in a self-refresh mode, a writing operation is first performed on all memory cells during the test operation S110. For example, the writing operation may be performed on the all memory cells, based on background write data having a desired (or alternatively, predetermined pattern). Then, a refresh operation is performed on the all memory cells. When a desired (or alternatively, predetermined) period of time (i.e., a required refresh period) passes, whether data of memory cells on which the refresh operation is performed is retained is determined. Data stored in the memory cells on which the refresh operation is performed and the above-described background write data may be compared with each other. A memory cell of which data corresponds to the background write data may be sorted as a good cell, and a memory cell of which data does not correspond to the background write data may be sorted as a bad cell.

Then, in a storing operation S120, a fail address corresponding to the bad cell is stored in a storage unit 730 included in the semiconductor memory device 700a, based on the test result. For example, during the storing operation S120, the test unit 720 may store a row address including the bad cell as a first fail address signal FA in the storage unit 730. As another example, the test unit 720 may store a block address (for example, the block address may be an address including a plurality of row addresses) including the row address including the bad cell as a fail address signal in the storage unit 730.

For example, as a result of performing the test operation S110 on a memory array 710 including the first memory cell MC1 and the second memory cell MC2, the first memory cell MC1 may be sorted as a good cell and the second memory cell MC2 may be sorted as a bad cell. In this case, the test unit 720 may store a row address (or a block address) including the second memory cell MC2 as a fail address in the storage unit 730.

Then, a refresh operation S130 may be performed. For example, according to an auto refresh mode or a self-refresh mode, the refresh operation S130 may be performed. During the refresh operation S130, a diversified refresh operation S130 may be performed based on the fail address stored in the storage unit 730. The refresh operation S130 will be described with reference to FIGS. 2 and 3.

Figure 2:
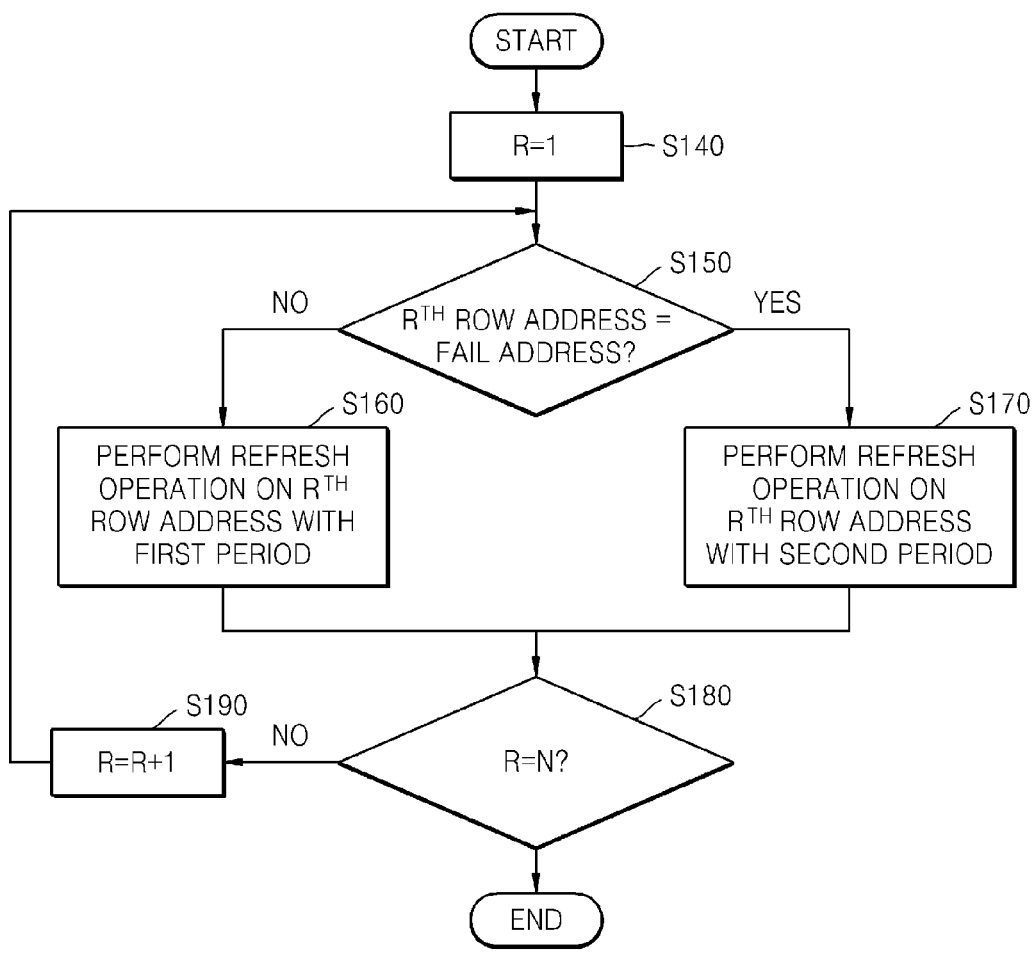
FIG. 2 shows a refresh operation of a case where a fail address is a row address, according to an example embodiment of the inventive concepts.
Figure 3:
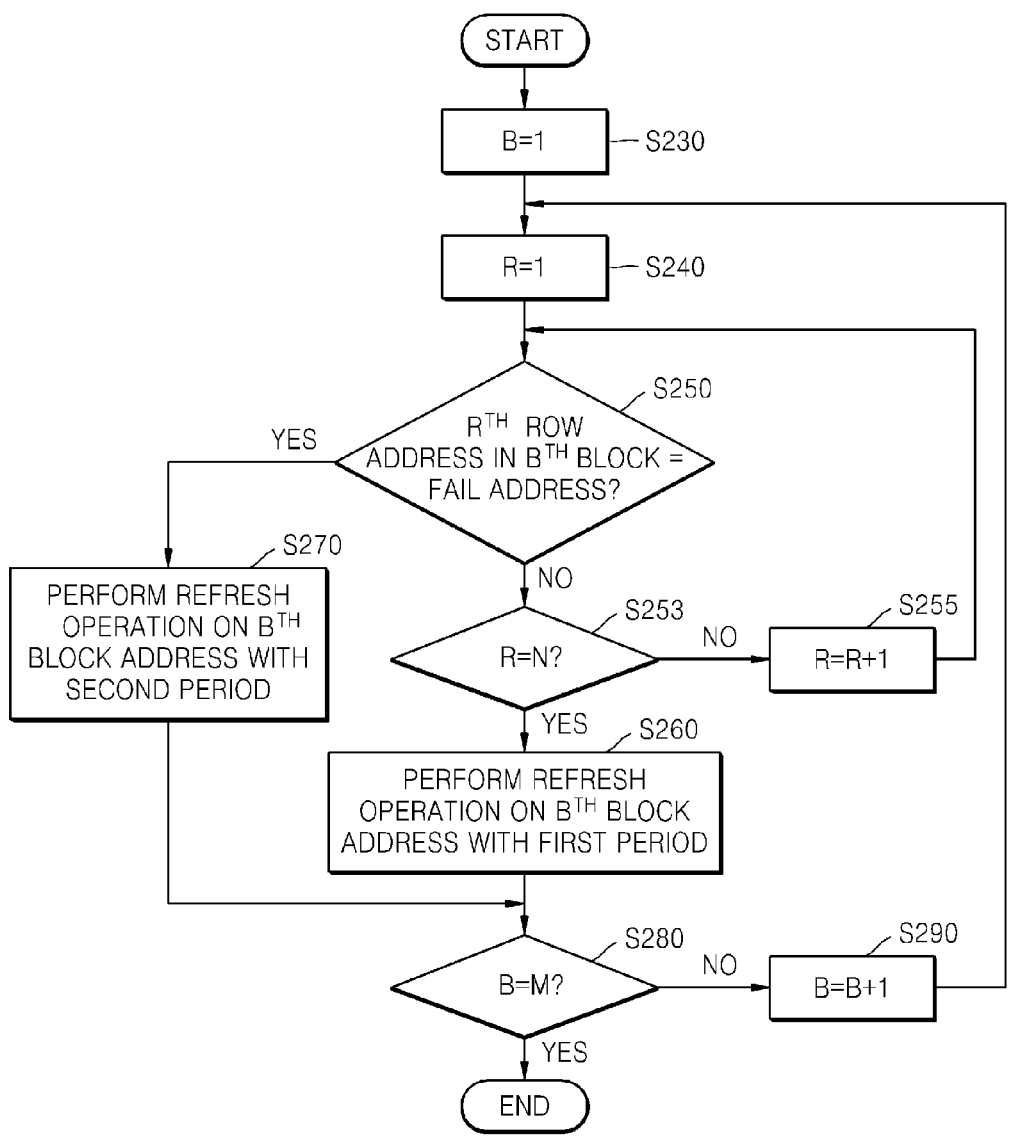
FIG. 3 shows a refresh operation of a case where a fail address is a block address, according to another example embodiment of the inventive concepts.

FIGS. 2 and 3 are flowcharts of a refresh operation of the operating method of the semiconductor memory device 700a of FIG. 1, according to an example embodiment of the inventive concepts.

FIG. 2 shows a refresh operation where a fail address is a row address, according to an embodiment of the inventive concepts.

Referring to FIG. 2, R=1 is set (S140) and whether an $R_{th}$ row address is the same as a fail address is determined (S150). If the $R_{th}$ row address is not the same as the fail address, then memory cells of the $R_{th}$ row address each correspond to a good cell. Thus, the $R_{th}$ row address is set such that a refresh operation may be performed with or according to a first period (S160).

Otherwise, if the $R_{th}$ row address is the same as the fail address, then memory cells of the $R_{th}$ row address each correspond to a bad cell. In this case, only when the refresh operation is performed on a memory cell of the $R_{th}$ row address with a relatively short refresh period, may data stored in the memory cell be retained. Thus, the $R_{th}$ row address may be set such that the refresh operation may be performed with or according to a second period that is shorter than the first period (S170).

Then, whether R=N (where R is a row address and N is the total number of row addresses) is determined (S180). If R≠N, then a refresh period is not set for all row addresses, and R may be increased by 1 (S190) and a loop (e.g., operations S150, S160, S170, and S180) may be repeated. Otherwise, if R=N, then a refresh period is set for all row addresses, and the refresh operation is terminated.

FIG. 3 shows a refresh operation where a fail address is a block address, according to another example embodiment of the inventive concepts.

Referring to FIG. 3, B=1 is set (S230) and R=1 is set (S240). Then, whether an $R_{th}$ row address included in a $B_{th}$ block is the same as a fail address is determined (S250). If the $R_{th}$ row address is the same as the fail address, then at least one memory cell included in the $B_{th}$ block including the $R_{th}$ row address corresponds to a bad cell. Thus, the $B_{th}$ block is set such that the refresh operation may be performed with a second period that is a short period in order to retain data of the bad cell (S270).

Otherwise, if the $R_{th}$ row address is not the same as the fail address, then whether R=N (where N is the number of row addresses in the $B_{th}$ block) is determined (S253). When R≠N, R is increased by 1 (S255), and a loop (for example, operations S250, S253, and S255) is repeated. Otherwise, if R=N, memory cells included in all row addresses of the $B_{th}$ block are each a good cell, and then the $B_{th}$ block address is set such that the refresh operation may be performed with a first period that is a long period (S260).

Then, whether B=M (where M is the total number of block addresses) is determined (S280). If B≠M, then a refresh period is not set for all block addresses, and B is increased by 1 and a loop (for example, operations S240, S250, S260, and S270) is repeated. Otherwise, if B=M, then the refresh operation is set for all memory blocks, and the refresh operation is terminated.

According to operations of each of the refresh operations shown in FIGS. 2 and 3, a refresh period of each row address (or a block address) may be set.

In this case, for example, a first period may be set as a refresh period for the first row address (or the first block address) including the first memory cell MC1 (refer to FIG. 10) and a second period that is shorter than the first period may be set as the refresh period for the second row address (or the second block address) including the second memory cell MC2 (refer to FIG. 10).

After the refresh operation S130 (refer to FIG. 1) is performed, a refresh operation may be performed on remaining memory cells in a memory array. For example, as shown in FIG. 2, during the refresh operation, a refresh may be performed on a first row address with a first period and may be performed on a second row address with a second period that is 0.5 times the first period. In this case, whether a refresh is performed at each time section of a refresh operation is shown in Table 1 below.

TABLE 1

|  | First Time section (T = 1) | Second Time section (T = 2) | Third Time section (T = 3) | Fourth Time section (T = 4) | Fifth Time section (T = 5) |
| --- | --- | --- | --- | --- | --- |
| First row address (First memory cell MC1) | O | X | O | X | O |
| Second row address (Second memory cell MC2) | O | O | O | O | O |

In Table 1, an 'O' indicates that a refresh has been performed at that time section and an 'X' indicates that a refresh has not been performed at that time section. As shown in Table 1 above, with regard to memory cells (for example, the first memory cell MC1 (refer to FIG. 10) included in the first row address, a refresh may be performed in the first time section, may not be performed in the second time section, and may be performed again in a third time section. That is, the refresh operation may refresh the memory cells (for example, the first memory cell MC1 (refer to FIG. 10) included in the first row address with or according to a first period corresponding to a time difference between the third time section and the first time section.

With regard to memory cells (for example, the second memory cell MC2 (refer to FIG. 10) included in the second row address, a refresh may be performed in the second time section and may be continually performed in the second time section and the third time section. That is, the refresh operation may be performed on the memory cells (for example, the second memory cell MC2 (refer to FIG. 10) included in the second row address with or according to a second period corresponding to a time difference between the second time section and the first time section.

Likewise, the first period may be a multiple of the second period, for example, the first period may be 2 times the second period. However, the inventive concepts are not limited thereto. For example, the first period may be 2.5 times or 3 times the second period.

Figure 4:
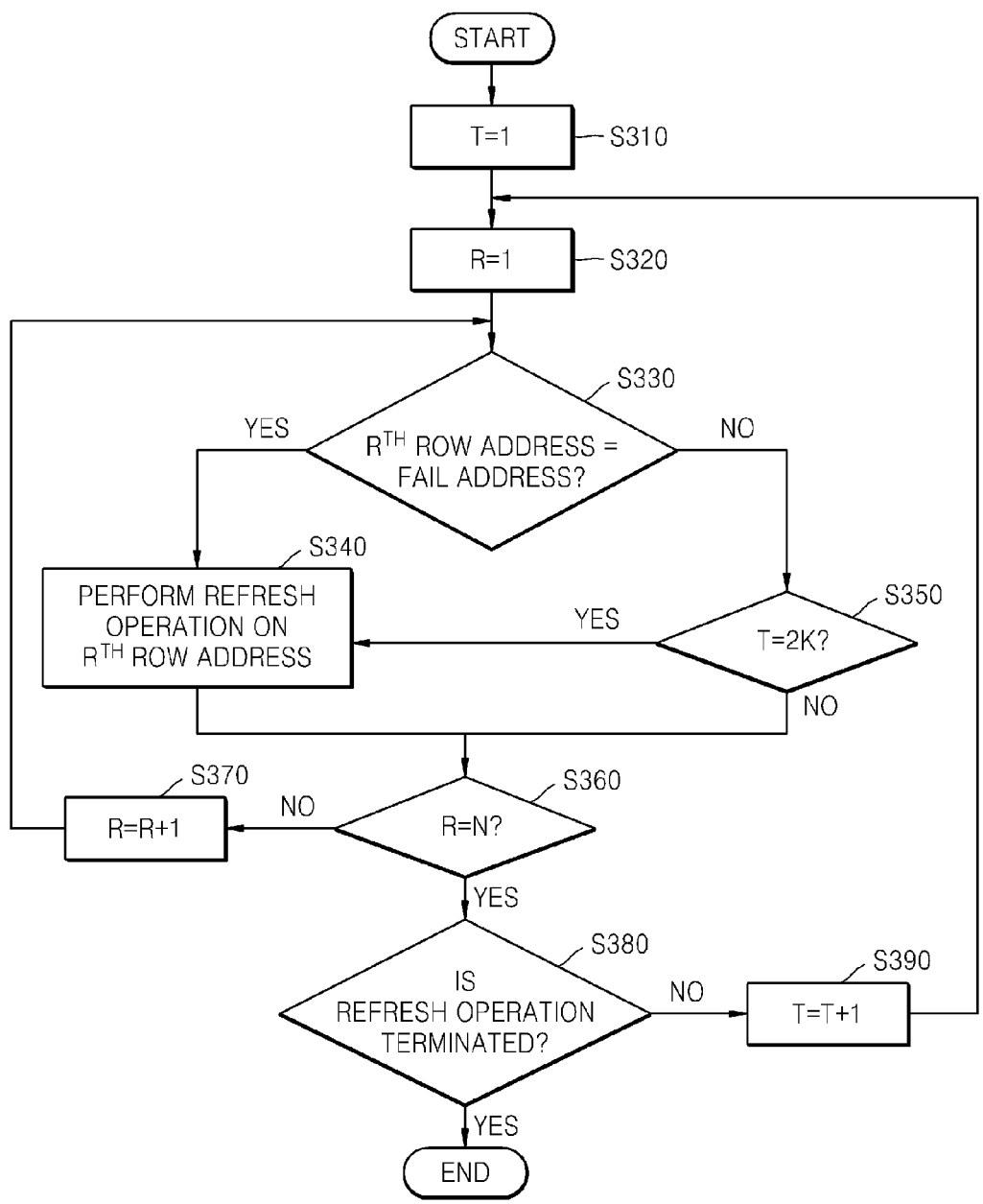
FIG. 4 is a flowchart of an operating method of a semiconductor memory device, according to another example embodiment of the inventive concepts.

FIG. 4 is a flowchart of an operating method of a semiconductor memory device, according to another example embodiment of the inventive concepts. FIG. 4 shows a refresh operation (for example, a self-refresh operation) according to Table 1, which is included in the operating method.

Referring to FIG. 4, T=1 is set (S310) and R=1 is set (S320), where T is a refresh time section indicator and R indicates a row address. Then, whether an $R_{th}$ row address is the same as a fail address is determined (S330). If the $R_{th}$ row address is the same as the fail address, then the refresh operation is performed on the $R_{th}$ row address (S340). If the $R_{th}$ row address is not the same as the fail address, whether T is a multiple of 2 is determined (S350). If T is a multiple of 2, then the refresh operation is performed on the $R_{th}$ row address (S340). Otherwise, when T is not a multiple of 2, the refresh operation is not performed on the $R_{th}$ row address.

Then, whether R=N (where R is a row address and N is the total number of row addresses) is determined (S360). If R≠N, then a refresh period is not set for all row addresses, and R is increased by 1 (S370) and a loop (for example, operations S330, S340, S350, and S360) is repeated. Otherwise, if R=N, then the refresh operation is performed on all row addresses in the $T_{th}$ time section. Whether the refresh operation is terminated is determined (S380). If the refresh operation is not terminated and is continually performed, then the refresh operation is repeatedly performed on all row addresses in a $(T+1)_{th}$ time section (S390).

FIG. 4 shows the refresh operation based on a row address but the inventive concepts are not limited thereto. For example, in the operating method according to an example embodiment, the refresh operation may be performed on a block address. In addition, FIG. 4 shows a self-refresh operation but the inventive concepts are not limited thereto. For example, a diversified refresh operation may also be performed in an auto refresh mode according to memory cells having different refresh characteristics.

Figure 5:
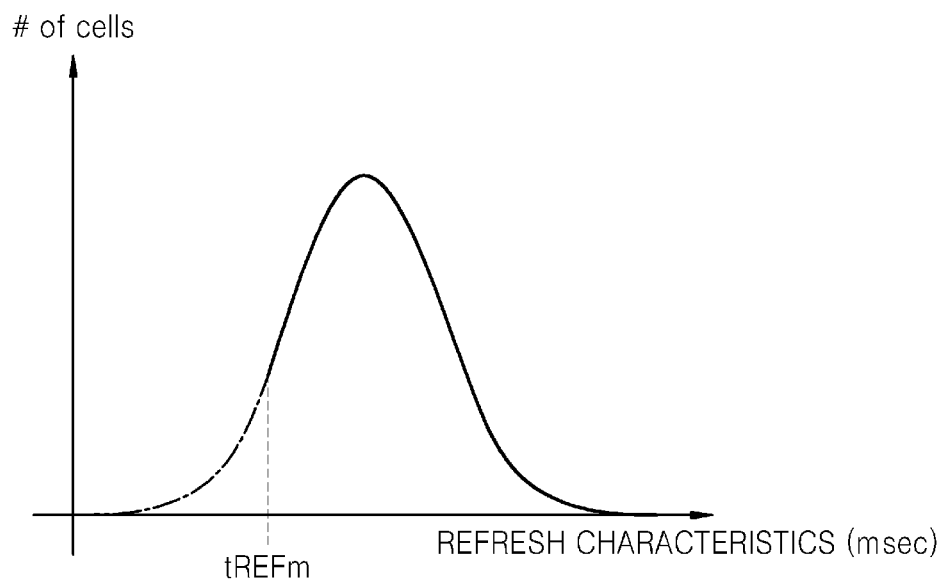
FIGS. 5 and 6 are graphs each showing a refresh period that is set by an operating method, according to at least one example embodiment of the inventive concepts.
Figure 6:
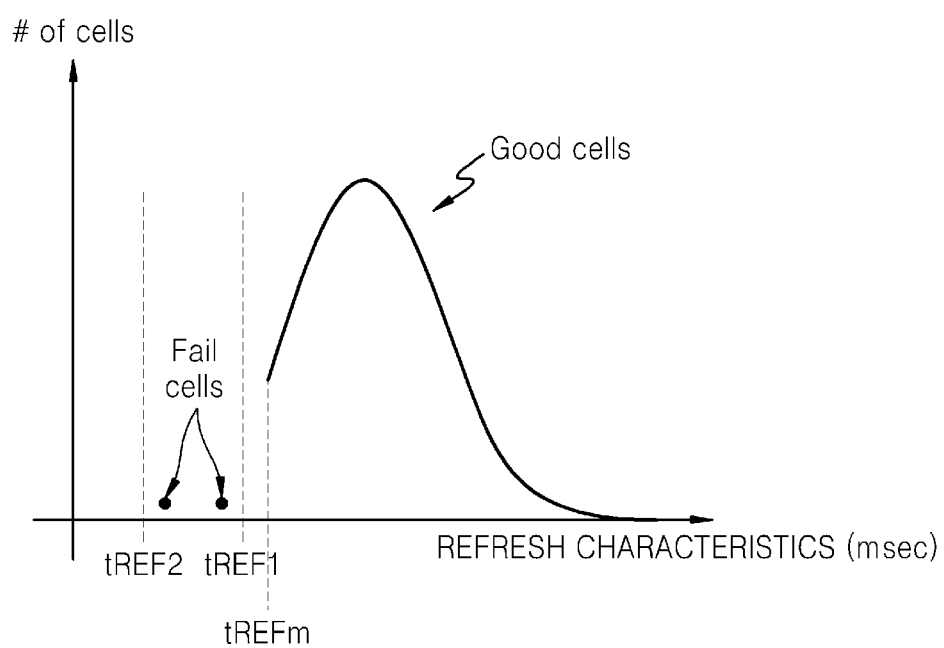

FIGS. 5 and 6 are graphs showing a refresh period that is set by an operating method, according to an example embodiment of the inventive concepts.

Memory cells in a semiconductor memory device that is manufactured by a wafer manufacturing process may have refresh characteristics (e.g., refresh periods) that vary according to statistical characteristics (e.g., Gaussian distribution). Then, as shown in FIG. 5, a wafer test operation and a repair operation may be performed so as to remove memory cells having bad refresh characteristics (e.g., a short refresh period). Thus, after the wafer test operation and the repair operation are performed, memory cells in the semiconductor memory device may have a refresh period of, for example, tREFm or more.

Then, after the wafer test operation is performed, the semiconductor memory device is completely manufactured as a memory module or a memory component during a process such as a packaging process or an assembly process. The semiconductor memory device may deteriorate during the packaging process or the assembly process. In this case, as shown in FIG. 6, the refresh characteristics of some memory cells from among memory cells having good refresh characteristics may deteriorate and thus the some memory cells may have bad refresh characteristics (e.g., a refresh period that is less than tREFm).

According to at least one example embodiment, the operating method of the semiconductor memory device is performed after information about memory cells that may deteriorate is stored in a storage unit and then a refresh operation is diversified for each respective cell based on the information. For example, a first memory cell having good refresh characteristics is determined as a good cell, a second memory cell having bad refresh characteristics is determined as a bad cell, and an address corresponding to the bad cell is stored in the storage unit.

Then, as shown in FIG. 6, during the refresh operation, the refresh operation is performed on the first memory cell that does not correspond to the address stored in the storage unit with a first period tREF1 and a refresh operation is performed on the second memory cell corresponding to the address stored in the storage unit with a second period that is shorter than the first period tREF1. That is, the diversified refresh operation may be performed.

Figure 7:
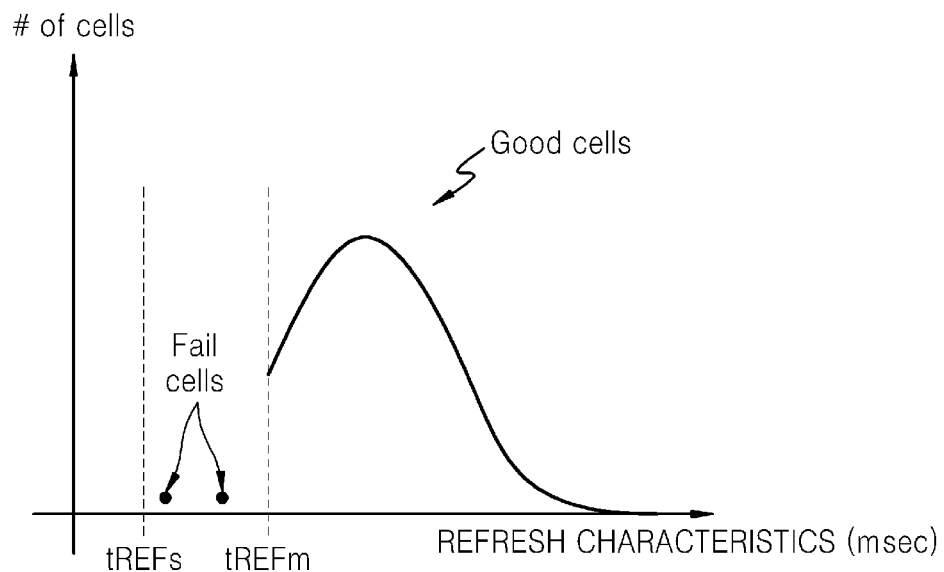
FIG. 7 is a graph showing a refresh period that is set in a unified refresh operation.

The diversified refresh operation is different from a unified refresh operation shown in FIG. 7. As shown in FIG. 7, when the unified refresh operation is performed, since the refresh characteristics of some memory cells deteriorate during the packaging process or the assembly process, a refresh operation needs to be performed with a shorter period tREFs than a period tREFm after a wafer test operation and a repair operation are performed on all memory cells.

However, with regard to the diversified refresh operation shown in FIG. 6, when the refresh characteristics of some memory cells deteriorate, the refresh operation may be performed on the some memory cells with a second short period tREF2 and may be performed on the remaining memory cells with a first long period tREF1. Thus, since most of the memory cells have a long refresh period (e.g., tREF1), a refresh current of a semiconductor memory device may be reduced.

Figure 8:
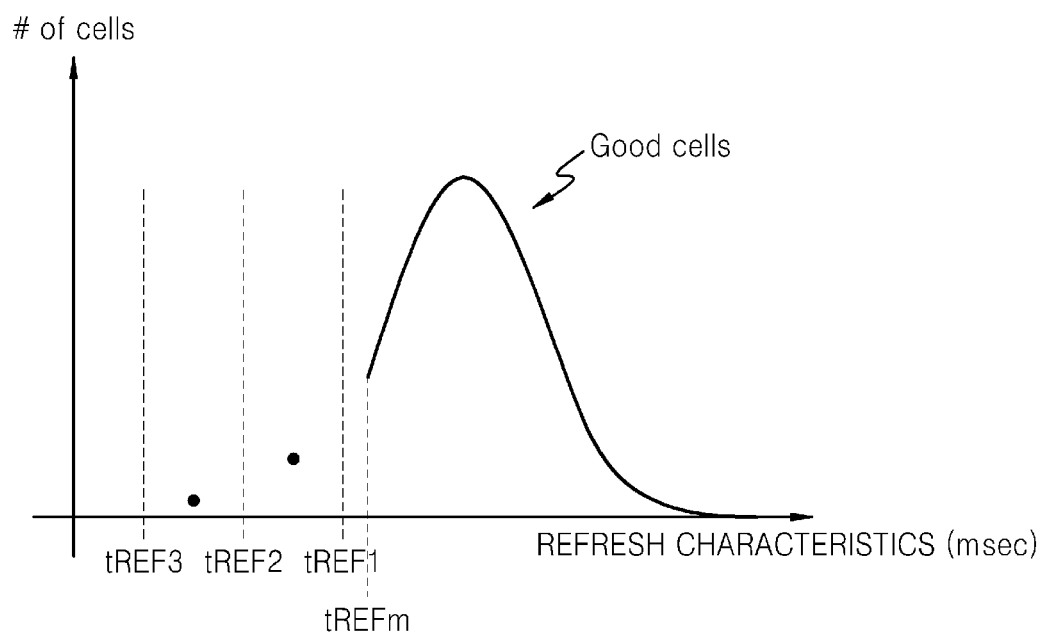
FIG. 8 is a graph showing a refresh period that is set in a ternate refresh operation.

Thus far, a binary refresh operation of first and second periods has been shown and described but the inventive concepts are not limited thereto. For example, as shown in FIG. 8, a refresh operation may be ternate to have a first period tREF1, a second period tREF2, and a third period tREF1.

The above-described example embodiments relate to a diversified refresh operation for improving refreshing characteristics, and more particularly, to an operating method of a semiconductor memory device that tests (e.g., S110 of FIG. 1) the refresh characteristics of a memory cell, as an example of a control parameter, stores (e.g., S120 of FIG. 1) a fail address in a storage unit based on the test result, and then performs the diversified refresh operation (e.g., S130 of FIG. 1) based on the stored fail address.

Figure 9:
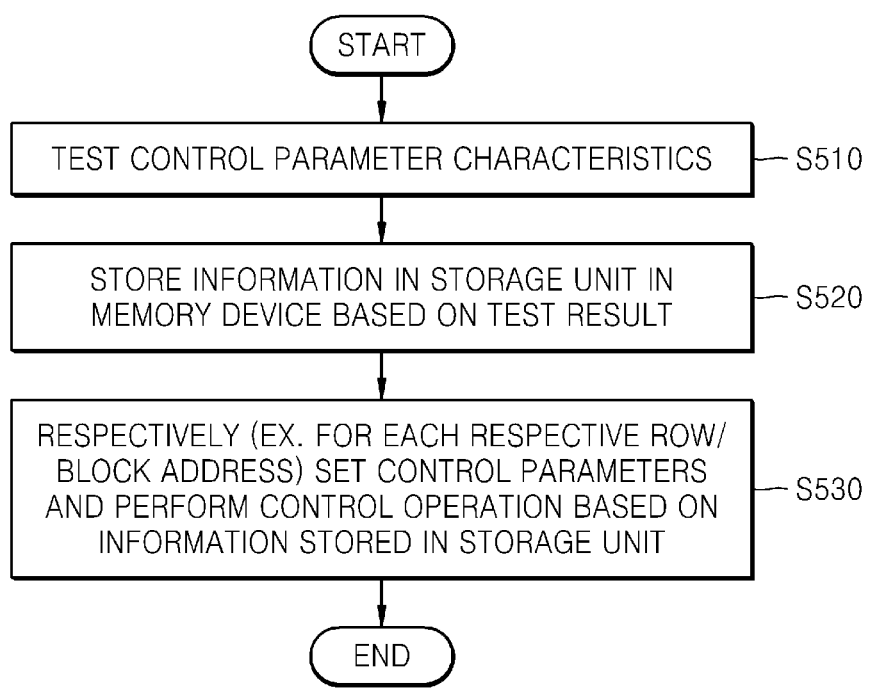
FIG. 9 is a flowchart of an operating method of a semiconductor memory device, according to another example embodiment of the inventive concepts.

However, the inventive concepts are not limited thereto. For example, as shown in FIG. 9, in an operating method of a semiconductor memory device, the characteristics of a desired (or alternatively, predetermined) control parameter may be tested (S510), information may be stored in a storage unit included in the semiconductor memory device based on the test result (S520), and then control parameters may be respectively set and a control operation is performed based on the stored information (S530).

FIG. 10 is a block diagram of a semiconductor memory device 700a according to an example embodiment of the inventive concepts.

Referring to FIG. 10, the semiconductor memory device 700a may include the memory array 710, the test unit 720, the storage unit 730, and a refresh unit 740.

The memory array 710 may include a plurality of memory cells. In more detail, the memory array 710 may include a plurality of banks. Each of the banks may include a plurality of memory cells that are arranged in rows and columns. The memory cells are arranged at intersections between a plurality of word lines and a plurality of bit lines.

The test unit 720 may be configured so as to test the refresh characteristics of the memory array 710 and to generate a first fail address signal FA. The first fail address signal FA may be a row address signal or a block address signal. In addition, the test unit 720 may generate the first fail address signal FA and may transmit the first fail address signal FA to the storage unit 730. The test unit 720 may be included in the semiconductor memory device 700a and may be, for example, a BIST unit.

The test unit 720 may be configured to perform operations of FIG. 2. For example, the test unit 720 may perform a refresh operation on the memory array 710 and may determine whether data stored in memory cells of the memory array 710 is retained after a desired (or alternatively, predetermined) period of time elapses. Then, the test unit 720 may be configured to store a row address signal, as the first fail address signal FA, which corresponds to a memory cell having data that is not retained, in the storage unit 730.

The storage unit 730 may be included in the semiconductor memory device 700a. The storage unit 730 may receive the first fail address signal FA that is transmitted from the test unit 720 to the test unit 720 and may store a first memory address signal FA. For example, the storage unit 730 may include at least one register such as a built in fail address memory (FAM), an electrical fuse, and a metal fuse.

The refresh unit 740 may be configured to perform a refresh operation on the memory array 710. In more detail, the refresh unit 740 may be configured to receive a refresh address signal RA from the memory array 710 and to rewrite (e.g., refresh) data stored in a memory cell corresponding to the refresh address signal RA. The refresh address signal RA may be a row address or a block address.

For example, the refresh unit 740 may receive the first fail address signal FA from the storage unit 730. Then, if the refresh unit 740 compares the refresh address signal RA and the first fail address signal FA, and the refresh address signal RA and the first fail address signal FA are not the same, the refresh unit 740 may perform the refresh operation on a memory cell (e.g., the first memory cell MC1) that corresponds to the refresh address signal RA (and that does not correspond to the first fail address signal FA) with a first period.

In addition, when the refresh unit 740 compares the refresh address signal RA and the first fail address signal FA, and the refresh address signal RA and the first fail address signal FA are the same, the refresh unit 740 may perform the refresh operation on a memory cell (e.g., the second memory cell MC2) that corresponds to the refresh address signal RA (and that does not correspond to the first fail address signal FA) with a second period that is shorter than the first period.

As described with reference to FIGS. 2 and 3, the refresh unit 740 may perform the refresh operation based on a row address or a block address.

In more detail, when the refresh unit 740 performs the refresh operation based on a row address, for example, the refresh unit 740 may perform the refresh operation based on a first row address corresponding to a good cell (e.g., the first memory cell MC1) with the first period and may perform the refresh operation based on a second row address corresponding to a bad cell (e.g., the second memory cell MC2) with the second period.

In addition, when the refresh unit 740 performs the refresh operation based on the block address, for example, the refresh unit 740 performs the refresh operation based on a first block address (e.g., a first memory block BLK0) corresponding to a good cell (e.g., the first memory cell MC1) with the first period and may perform the refresh operation based on a second block address corresponding to a bad cell (e.g., the second memory cell MC2) with the second period.

As described with reference to Table 1 above, the first period may be a multiple of the second period. The storage unit 730 may further store information (e.g., that the first period is a multiple of the second period) about the first period and the second period. In this case, the refresh unit 740 may receive the information from the storage unit 730 and may perform the refresh operation on the memory array 710 with the first period or the second period.

In order to perform the refresh operation, the refresh unit 740 may transmit a period setting signal TI. In more detail, the refresh unit 740 may transmit, for example, the period setting signal TI to a row address buffer refresh counter 790 (refer to FIG. 12) included in the memory array 710, which will be described in more detail with reference to FIG. 12.

A semiconductor memory device according to the inventive concepts may not perform a refresh operation on all memory cells with a short period, but instead may perform the refresh operation on a good cell with a long period and may perform the refresh operation on a bad cell with a short period in consideration of the deteriorated refresh characteristics of the bad cell. As a result, the refresh operation is performed on only the small number of deteriorated bad cells with a short period and is performed on most good cells with a long period, thereby reducing a refresh current of all memory cells.

FIG. 10 shows a refresh unit that performs the binary refresh operation with the first period and the second period.

However, the inventive concepts are not limited thereto. For example, the refresh unit 740 may perform a ternate refresh operation with a first period, a second period, and a third period.

In this case, the test unit 720 may be configured to test the refresh characteristics of a plurality of memory cells included in the memory array 710 and to generate a second fail address signal, and the storage unit 730 may be configured to store the second fail address signal. In addition, the refresh unit 740 may be configured to perform the refresh operation on a third memory cell corresponding to the second fail address signal with a third period that is shorter than the second period.

In more detail, for example, the refresh unit 740 may perform the refresh operation based on a refresh address corresponding to the first memory cell MC1 having first refresh characteristics with a first period. In addition, the refresh unit 740 may perform the refresh operation based on a refresh address corresponding to the second memory cell MC2 having second refresh characteristics that are relatively more deteriorated than the first refresh characteristics with a second period that is shorter than the first period. Furthermore, the refresh unit 740 may perform the refresh operation based on a refresh address corresponding to a third memory cell having third refresh characteristics that are relatively more deteriorated than the second refresh characteristics with a third period that is shorter than the second period.

Figure 11:
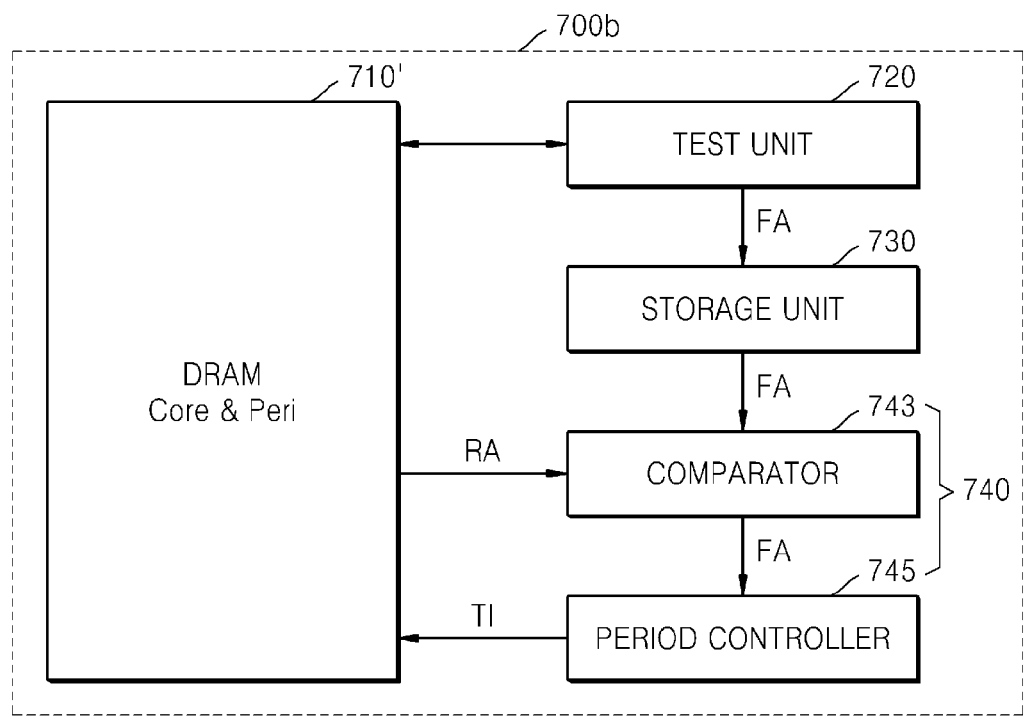
FIG. 11 is a block diagram of a semiconductor memory device according to another example embodiment of the inventive concepts.

FIG. 11 is a block diagram of a semiconductor memory device 700b according to another example embodiment of the inventive concepts. The semiconductor memory device 700b of FIG. 11 is a modified embodiment of the semiconductor memory device 700a of FIG. 10 and thus a repeated explanation thereof will not be provided.

Referring to FIG. 11, the semiconductor memory device 700b may include a dynamic random access memory (DRAM) core/peri 710', the test unit 720, the storage unit 730, and the refresh unit 740. In particular, the refresh unit 740 may include a comparator 743 and a period controller 745.

The comparator 743 may compare the first fail address signal FA and the refresh address signal RA, and may generate a comparison signal CR. The comparison signal CR indicates whether a memory cell corresponding to the refresh address signal RA is a good cell or a bad cell. For example, the comparator 743 may compare a first row address signal corresponding to a good cell (e.g., the first memory cell MC1) and the first fail address signal FA and may generate the comparison signal CR (e.g., '0') indicating a good cell. In addition, the comparator 743 may compare a second row address signal corresponding to a bad cell (e.g., the second memory cell MC2) with the first fail address signal FA and may generate the comparison signal CR (e.g., '1') indicating a bad cell.

The period controller 745 may be configured to generate the period setting signal TI based on the comparison signal CR and to transmit the period setting signal TI to the DRAM core/peri 710'. The period setting signal TI may be defined as a signal that allows the refresh operation of the first memory cell MC1 and the second memory cell MC2 to be performed with the first period or the second period.

Figure 12:
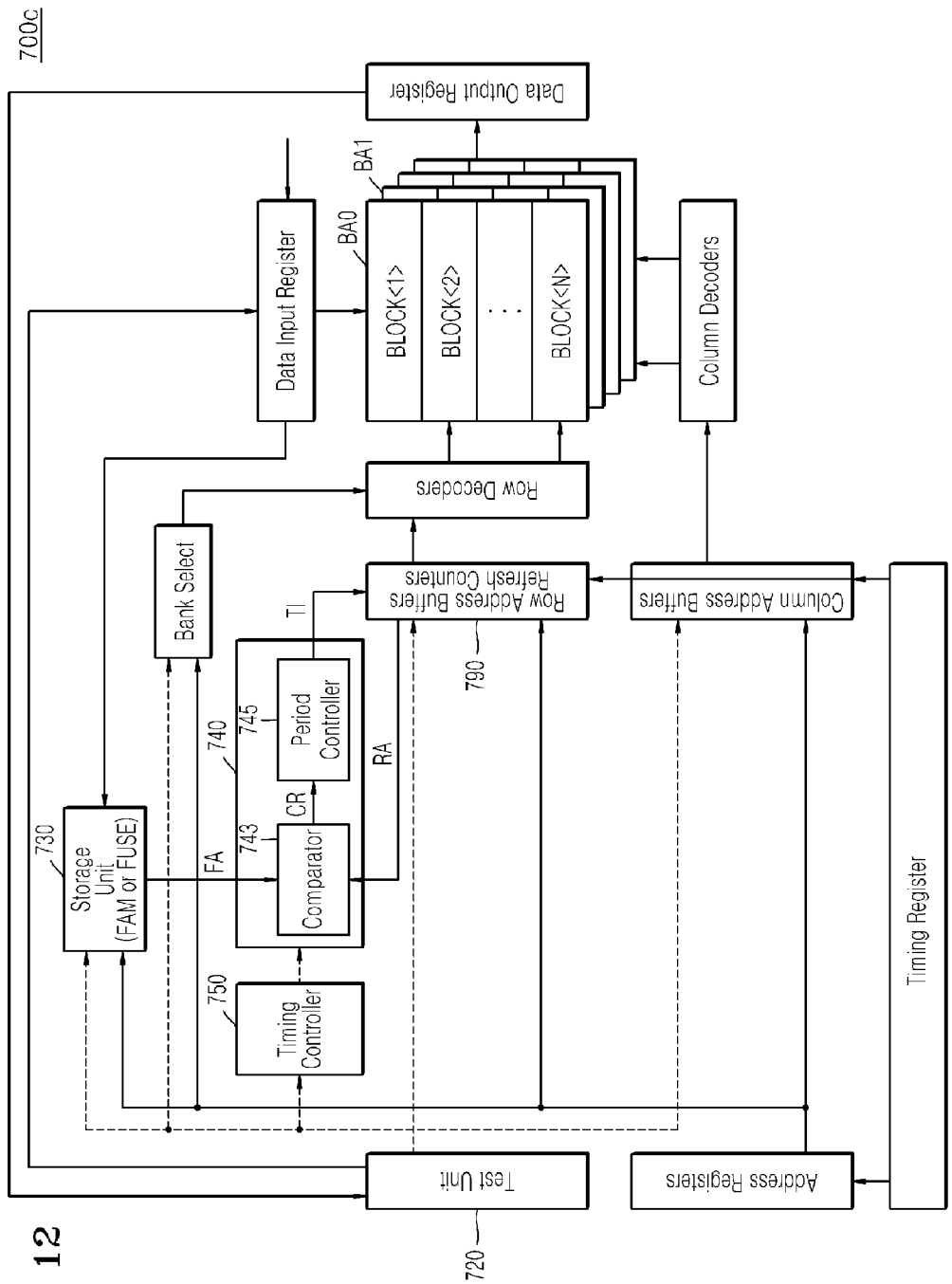
FIG. 12 is a block diagram of a semiconductor memory device according to another example embodiment of the inventive concepts.

A semiconductor memory device 700c including components of the DRAM core/peri 710' is shown in FIG. 12. Referring to FIG. 12, the period controller 745 included in the refresh unit 740 may generate the period setting signal TI and may transmit the period setting signal TI to the row address buffer refresh counter 790. For example, the period setting signal TI may be a signal for activating the row address buffer refresh counter 790.

When the refresh unit 740 is activated by a timing controller in order to perform a refresh operation, the comparator 743 may receive the refresh address signal RA from the row address buffer refresh counter 790 and may receive the first fail address signal FA from the storage unit 730. Then, the comparator 743 may compare the refresh address signal RA and the first fail address signal FA, may generate the comparison signal CR indicating a good cell or a bad cell, and may transmit the comparison signal CR to the period controller 745.

The period controller 745 may generate the period setting signal TI based on the comparison signal CR and may transmit the period setting signal TI to the row address buffer refresh counter 790. As described above, the period setting signal TI may be a signal for activating the row address buffer refresh counter 790.

For example, when the period controller 745 receives the comparison signal CR (e.g., '0') indicating a good cell, the period controller 745 may activate the row address buffer refresh counter 790 in a first time section and may not activate the row address buffer refresh counter 790 in a second time section. On the other hand, when the period controller 745 receives the comparison signal CR (e.g., '1') indicating a bad cell, the period controller 745 may activate the row address buffer refresh counter 790 in the first time section and the second time section.

Selectively, the memory array 710 may include a first bank BA0 and a second bank BA1 which each include the first memory cell MC1 and the second memory cell MC2. While the second bank BA1 is activated, the first bank BA0 may be inactivated. In this case, the refresh unit 740 may perform the refresh operation (e.g., a self-refresh mode) on the first bank BA0 that is inactivated during a writing/reading operation of the second bank BA1 that is activated.

Figure 13:
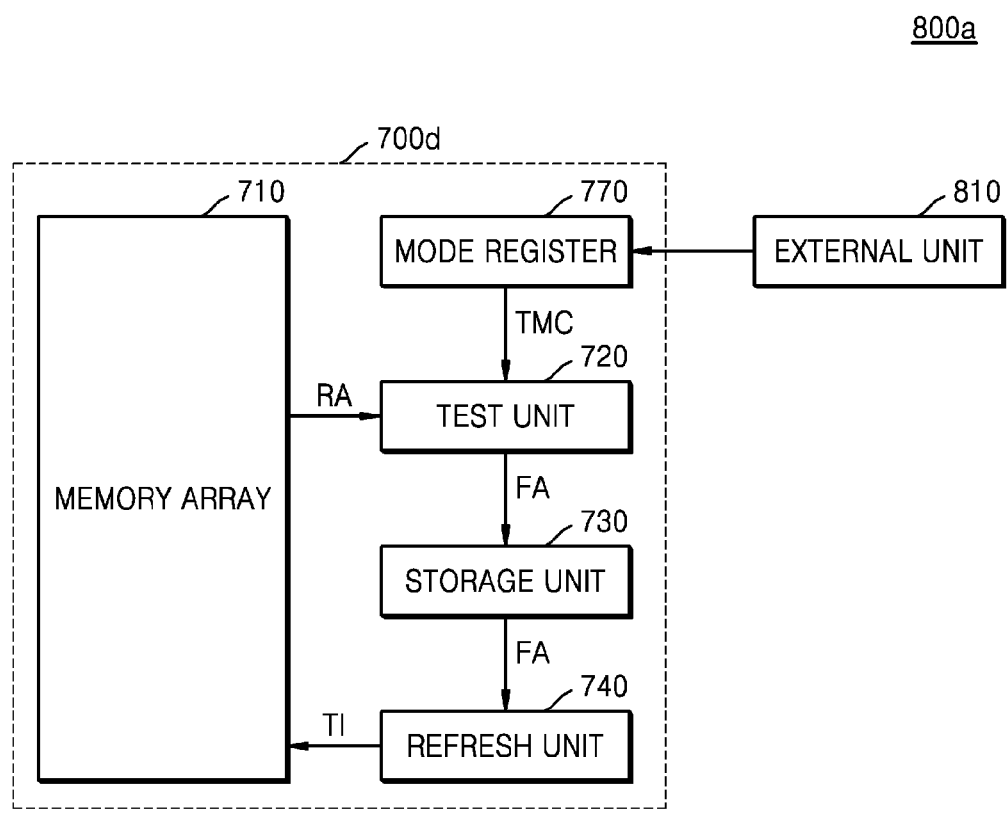
FIG. 13 is a block diagram of a semiconductor memory device and a system including the same, according to an example embodiment of the inventive concepts.

FIG. 13 is a block diagram of a semiconductor memory device 700d and a system 800a (e.g., a test system or a computing system) including the same, according to an example embodiment of the inventive concepts.

Referring to FIG. 13, the semiconductor memory device 700d may include the test unit 720, the storage unit 730, and the refresh unit 740. The descriptions of the test unit 720, the storage unit 730, and the refresh unit 740 are the same or similar as those with respect to FIGS. 11 and 12 and thus repeated descriptions thereof will not be provided.

The semiconductor memory device 700d may further include a mode register 770. The mode register 770 may store information required for an operation of the semiconductor memory device 700d and information for users. Users such as vendors and end users may add a user specific code to the information for users. For example, the user specific code may be a test mode code TMC.

The test unit 720 may be configured to be activated in response to the test mode code TMC stored in the mode register 770. Thus, a calibration process may be performed to store a fail address signal in the storage unit 730 by simply calibrating software without performing any separate calibration process on hardware.

For example, a user such as a vendor may perform a calibration on a complete product. The complete product may be a semiconductor memory device including a memory cell that deteriorates during an assembly process and the refresh characteristics of some memory cells may deteriorate. In this case, the vendor may transmit the test mode code TMC to the mode register 770 included in the semiconductor memory device 700d through the external device 810 (e.g., a control unit included in a test system) and thus the test mode code TMC may be stored in the mode register 770. In this case, the test unit 720 included in the semiconductor memory device 700d may receive the test mode code TMC from the mode register 770, may be activated, and may perform a test operation. After the test operation is performed, since a fail address signal is stored in the storage unit 730, the refresh unit 740 may perform a diversified refresh operation.

Similarly, a user such as an end user may also perform a calibration process on a complete product. The complete product may be the semiconductor memory device 700d including a memory cell that deteriorates during an assembly process, a transfer process, and a sale process and the refresh characteristics of some memory cells may deteriorate. In this case, the end user transmits the test mode code TMC to the mode register 770 included in the semiconductor memory device 700d through the external device 810 (e.g., a memory control unit included in a computing system) and thus the test mode code TMC may be stored in the mode register 770. In this case, the test unit 720 included in the semiconductor memory device 700d may receive the test mode code TMC from the mode register 770, may be activated, and may perform a test operation. After the test operation is performed, since a fail address signal is stored in the storage unit 730, the refresh unit 740 may perform a diversified refresh operation.

Figure 14:
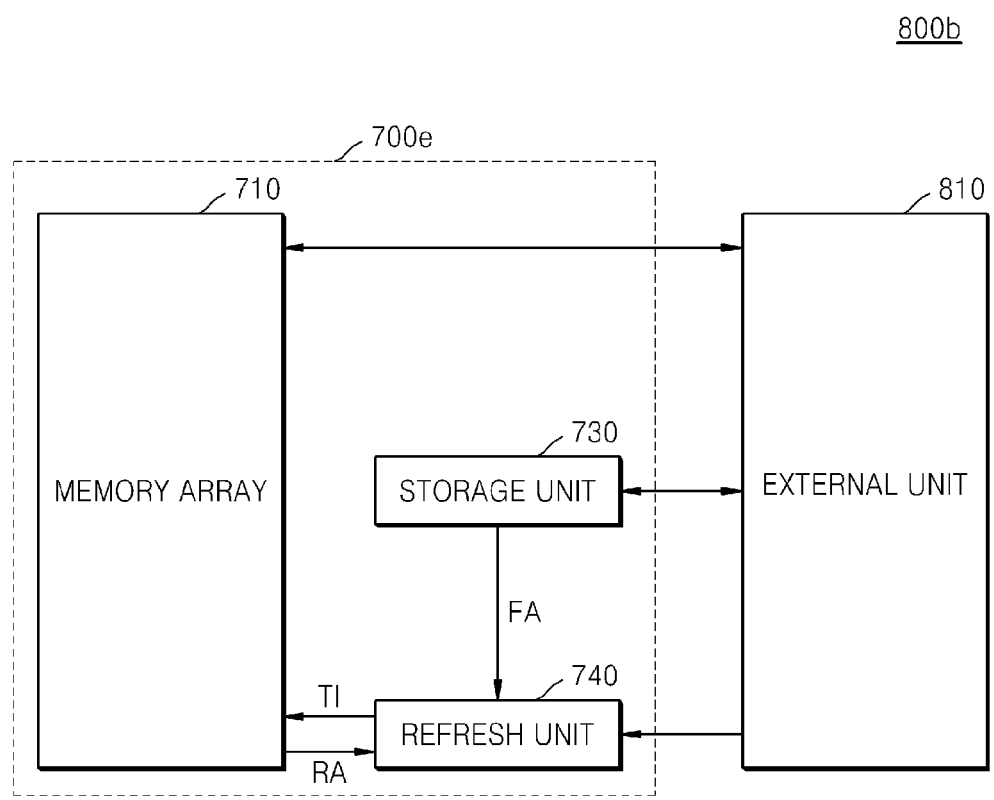
FIG. 14 is a block diagram of a semiconductor memory device and a system including the same, according to another example embodiment of the inventive concepts.

FIG. 14 is a block diagram of a semiconductor memory device 700e and a system 800b including the same, according to another example embodiment of the inventive concepts.

Referring to FIG. 14, the semiconductor memory device 700e may include the storage unit 730 and the refresh unit 740. The descriptions of the storage unit 730 and the refresh unit 740 are the same or similar as those with respect to FIGS. 11 and 12 and thus repeated descriptions thereof will not be provided.

In FIG. 13, the test unit 720 included in the semiconductor memory device 700d is activated by the external device 810 (e.g., a BIST unit). However, in FIG. 14, the external device 810 included in the system 800b may directly perform a test operation.

For example, in a test system (or alternatively, a computing system) of FIG. 14, the external device 810 such as a memory control unit may be configured to test the refresh characteristics of the memory array 710 included in the semiconductor memory device 700e, may generate a fail address signal, and may store the fail address signal in the storage unit 730 included in the semiconductor memory device 700e. Thus, the refresh unit 740 may perform a diversified refresh operation based on the fail address signal stored in the storage unit 730.

Figure 15:
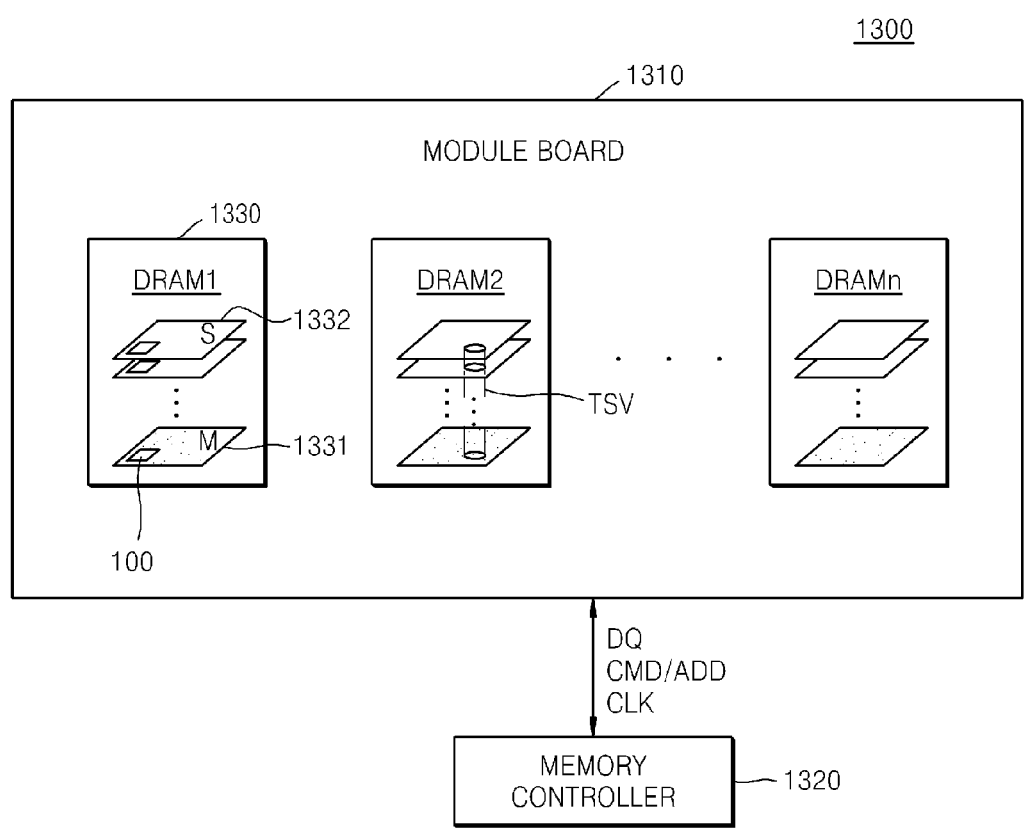
FIG. 15 is a diagram of a memory system to which the semiconductor memory devices of FIGS. 10 through 14 are applied, according to an example embodiment of the inventive concepts.

FIG. 15 is a diagram of a memory system 1300 to which the semiconductor memory devices 700a, 700b, 700c, 700d, and 700e of FIGS. 10 through 14 are applied, according to an example embodiment of the inventive concepts.

Referring to FIG. 15, the memory system 1300 may include a memory module 1310 and a memory controller 1320. The memory module 1310 may be configured by installing at least one semiconductor memory device 1330 on a module board. The semiconductor memory device 1330 may be a DRAM and may include a plurality of semiconductor layers. The semiconductor layers may each include at least one master chip 1331 and at least one slave chip 1332. Signals may be transmitted between the semiconductor layers through a through silicon via TSV. The master chip 1331 and the slave chip 1332 may include a memory array, a storage unit, and a refresh unit. In addition, the master chip 1331 and the slave chip 1332 may further include a test unit.

The memory module 1310 may communicate with the memory controller 1320 through a system bus. Data DQ, command/address CMD/ADD, a clock signal CLK, or the like may be transmitted between the memory module 1310 and the memory controller 1320 through the system bus.

Figure 16:
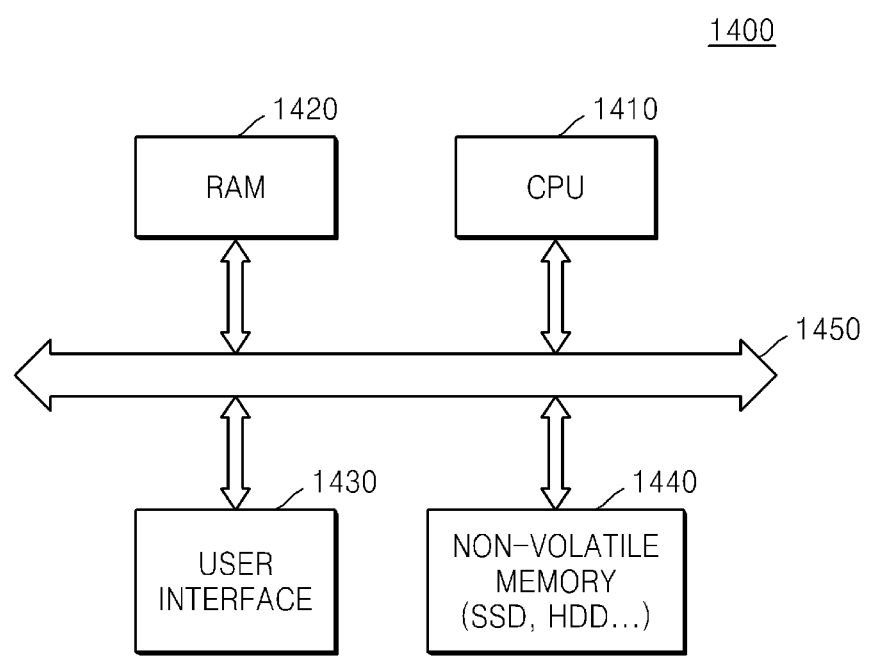
FIG. 16 is a block diagram of a computing system including a memory system installed therein, according to an example embodiment of the inventive concepts.

FIG. 16 is a block diagram of a computing system 1400 including a memory system installed therein, according to an example embodiment of the inventive concepts.

Referring to FIG. 16, a semiconductor memory device according to an example embodiment of the inventive concepts may be installed as a random access memory (RAM) 1420 in the computing system 1400 such as a mobile device or a desk top computer. The semiconductor memory device that is installed as the RAM 1420 may be any one of the semiconductor memory devices according to the above-described example embodiments of the inventive concepts. For example, the RAM 1420 may be the above-described semiconductor memory device or a memory module. In addition, the RAM 1420 may include a semiconductor memory device and a memory controller.

The computing system 1400 may include a central processing unit (CPU) 1410, the RAM 1420, a user interface 1430, and a non-volatile memory 1440. The CPU 1410, the RAM 1420, the user interface 1430, and the non-volatile memory 1440 may be electrically connected to a bus 1450. The non-volatile memory 1440 may be a large-capacity storage device such as a solid state drive (SSD) or a hard disk drive (HDD).

The attached drawings for illustrating example embodiments of the inventive concepts have been referred to in order to gain a sufficient understanding of the inventive concepts. The inventive concepts may, however, be embodied in many different forms and should not be construed as limited to the example embodiments shown in the attached drawings. Like reference numerals in the drawings denote like elements.

While the inventive concepts have been particularly shown and described with reference to example embodiments thereof, it will be understood that various changes in form and details may be made therein without departing from the spirit and scope of the following claims.

What is claimed is:

1. A semiconductor memory device comprising:
   a memory array including a plurality of memory cells;
   a mode register configured to receive and store a user specific test mode code;
   a test unit configured to test refresh characteristics of the memory array and generate a first fail address signal based on the user specific test mode code;
   a storage unit configured to store the first fail address signal; and
   a refresh unit configured to perform a refresh operation on the memory array, the refresh unit being configured to receive the first fail address signal from the storage unit, refresh a first memory cell that does not correspond to the first fail address signal according a first period, and refresh a second memory cell that corresponds to the first fail address signal according to a second period that is shorter than the first period.

2. The semiconductor memory device of claim 1, wherein the test unit is configured to perform the refresh operation on the memory array, determine whether the memory array retains data after a time period elapses, and store a row address signal corresponding to a memory cell that does not retain the data in the storage unit as the first fail address signal.

3. The semiconductor memory device of claim 1, wherein the refresh unit comprises:
   a comparator configured to compare the first fail address signal with a first address signal corresponding to the first memory cell and the first fail address signal with a second address signal corresponding to the second memory cell, and generate a comparison signal; and a period controller configured to generate a period setting signal according to the comparison signal and transmit the period setting signal to the memory array.

4. The semiconductor memory device of claim 1, wherein the test unit is configured to activate in response to the user specific test mode code stored in the mode register.

5. The semiconductor memory device of claim 1, wherein the first period is a multiple of the second period.

6. The semiconductor memory device of claim 1, wherein the storage unit includes an electrical fuse.

7. The semiconductor memory device of claim 1, wherein
the memory array includes a first memory block including the first memory cell, and a second memory block including the second memory cell, and
the refresh unit is configured to refresh the first memory block according to the first period and refresh the second memory block according to the second period.

8. The semiconductor memory device of claim 1, wherein
the memory array includes a first bank and a second bank, each of the first bank and the second bank including a first memory cell and a second memory cell,
while the second bank is activated, the first bank is inactivated, and
the refresh unit is configured to refresh the first memory cell and the second memory cell of the first bank that is inactivated.

9. The semiconductor memory device of claim 1, wherein
the test unit is configured to test the refresh characteristics of the plurality of memory cells and generate a second fail address signal,
the storage unit is configured to store the second fail address signal, and
the refresh unit is configured to refresh a third memory cell corresponding to the second fail address signal according to a third period that is shorter than the second period.

10. A system comprising:
the semiconductor memory device of claim 1; and
an external device configured to issue a command, the command activating the test unit included in the semiconductor memory device.

11. The system of claim 10, wherein the external device is configured to transmit the user specific test mode code to the mode register, the mode register is configured to store the user specific test mode code in the mode register when the user specific test mode code is received from the external device, and the test unit is configured to activate in response to the user specific test mode code being stored in the mode register.

12. A semiconductor memory device comprising:
a memory array including a first memory cell and a second memory cell;
a mode register configured to receive and store a user specific test mode code;
a storage unit configured to store as a fail address signal a second address signal corresponding to the second memory cell, the fail address signal being generated based on the user specific test mode code; and
a refresh unit configured to perform a refresh operation on the memory array, the refresh unit being configured to receive the fail address signal from the storage unit, not refresh the first memory cell and refresh the second memory cell in a first time section of the refresh operation, and the refresh unit being configured to refresh both the first memory cell and the second memory cell in a second time section of the refresh operation.

13. The semiconductor memory device of claim 12, wherein the refresh unit is configured to refresh the second memory cell according to a second period corresponding to a time difference between the first time section and the second time section, and refresh the first memory cell according to a first period that is longer than the second period.

14. The semiconductor memory device of claim 12, further comprising:
a built in self-test (BIST) unit configured to test refresh characteristics of the memory array, generate the fail address signal, and store the fail address signal in the storage unit.

15. A system comprising:
the semiconductor memory device of claim 12; and
a memory control unit configured to control the semiconductor memory device, the memory control unit being configured to test refresh characteristics of the memory array included in the semiconductor memory device, generate the fail address signal, and store the fail address signal in the storage unit.

16. A semiconductor memory device comprising:
a memory cell;
a mode register configured to receive and store a user specific test mode code;
a test unit configured to test refresh characteristics of the memory cell to determine whether the memory cell is a good cell or a bad cell, the testing being based on the user specific test mode code;
a storage unit configured to store a row address of the memory cell if the memory cell is a bad cell; and
a refresh unit configured to perform a refresh operation on the memory cell according to a refresh period, the refresh period being based on whether the memory cell is a good cell or a bad cell.

17. The device of claim 16, wherein the refresh period is a first period if the memory cell is a good cell and the refresh period is a second period if the memory cell is a bad cell, and the second period is shorter than the first period.

18. The device of claim 16, wherein the refresh operation includes first, second, and third time sections, and the refresh unit is configured to refresh a good cell at the first and third time sections and refresh a bad cell at the first, second, and third time sections.

19. The device of claim 16, wherein the memory cell is one of a plurality of memory cells in a memory array, and the refresh unit is configured to refresh each memory cell in the memory array according to the refresh period.

20. The device of claim 16, wherein the refresh unit includes:
a comparator configured to generate a comparison signal based on the stored row address of the memory cell and a refresh address, the comparison signal indicating whether the refresh address corresponds to a good cell or a bad cell; and
a period controller configured to generate a period setting signal indicating the refresh period based on the comparison signal.

* * * * *